United States Patent
Pressel et al.

(10) Patent No.: US 7,799,659 B2
(45) Date of Patent: Sep. 21, 2010

(54) SINGULATING SEMICONDUCTOR WAFERS TO FORM SEMICONDUCTOR CHIPS

(75) Inventors: Klaus Pressel, Regensburg (DE); Adolf Koller, Regensburg (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 460 days.

(21) Appl. No.: 11/765,074

(22) Filed: Jun. 19, 2007

(65) Prior Publication Data

US 2007/0293020 A1    Dec. 20, 2007

(30) Foreign Application Priority Data

Jun. 20, 2006  (DE)  ......... 10 2006 028 718

(51) Int. Cl.
*H01L 21/326* (2006.01)

(52) U.S. Cl. .......... 438/460; 438/33; 438/113; 438/458; 438/463; 438/487

(58) Field of Classification Search .......... 438/33, 438/68, 113, 458, 460, 463, 487, 535, 940, 438/FOR. 386; 257/E21.214, E21.237, E21.238, 257/E21.483, E21.028, E21.134, E21.347, 257/E21.596, E23.148, E23.15

See application file for complete search history.

(56) References Cited

U.S. PATENT DOCUMENTS

| | | | | |
|---|---|---|---|---|
| 4,684,413 | A | * | 8/1987 | Goodman et al. ........... 438/798 |
| 6,054,369 | A | * | 4/2000 | Neilson et al. ............. 438/455 |
| 2005/0003633 | A1 | | 1/2005 | Mahle et al. |
| 2005/0170616 | A1 | | 8/2005 | Murata et al. |

FOREIGN PATENT DOCUMENTS

| | | |
|---|---|---|
| DE | 10 2005 004 827 | 9/2005 |
| JP | 63 036988 | 2/1988 |
| JP | 63 293939 | 11/1988 |

OTHER PUBLICATIONS

Synova, Cutting of Thin Wafers with Synova Laser-Microjet, Synova S.A., 2004, 3 pages.

* cited by examiner

*Primary Examiner*—N Drew Richards
*Assistant Examiner*—Joannie A Garcia
(74) *Attorney, Agent, or Firm*—Dicke, Billig & Czaja, PLLC

(57) ABSTRACT

One aspect relates to a method for singulating semiconductor wafers to form semiconductor chips. A semiconductor wafer is provided with semiconductor chip positions arranged in rows and columns, rectilinear separating tracks being arranged between the positions. Crystallographic strains are induced into the region of the separating tracks. This is followed by a laser ablation along the separating tracks, the semiconductor wafer being separated into individual semiconductor chips.

15 Claims, 5 Drawing Sheets

SINGULATING SEMICONDUCTOR WAFERS TO FORM SEMICONDUCTOR CHIPS

CROSS-REFERENCE TO RELATED APPLICATIONS

This Utility Patent Application claims priority to German Application No. DE 10 2006 028 718.5, filed Jun. 20, 2006, which is herein incorporated by reference.

BACKGROUND

The invention relates to singulating semiconductor wafers to form semiconductor chips. The process involves producing a semiconductor wafer having semiconductor chip positions arranged in rows and columns, rectilinear separating tracks being arranged between the semiconductor chip positions.

Usually, the semiconductor wafer is severed rectilinearly along the separating tracks by using a saw blade fitted with diamond chips. For this purpose, the saw blade has a metal film disk having a thickness of a few tens of micrometers that rotates at high speed, the metal film disk being supported by a saw blade body that is made to perform revolutions of more than 3000 revolutions per minute by an air-supported motor. On account of the disk-shaped metal film being covered with diamond chips, it is possible to introduce sawing grooves into the semiconductor crystal along the separating tracks with a width of less than 100 micrometers.

Such a sawing method by using diamond sawing is known from the document US 2005/0003633 A1. It is simultaneously established in the document that diamond sawing is problematic, particularly at the exit of the saw blade on the rear side of the semiconductor wafer. The rear side has high internal strains, especially as the rear side has less planarity and greater roughness than the active top side of the semiconductor wafer, such that chipping, microcracks and/or crystal defects occur when the semiconductor wafer is separated into individual semiconductor chips.

Consequently, the separation of semiconductor wafers by using diamond sawing is problematic and not satisfactory. In particular thin semiconductor wafers are moreover mechanically damaged by the sawing forces, which generate a high stress state in the crystal, very rapidly on account of microcracks and strains due to chipping. This becomes apparent particularly when the entire thickness of the semiconductor wafer is to be severed.

This problem is partly circumvented by using a semiconductor wafer being only incipiently sawn by introducing separating joints along the separating tracks. The semiconductor wafer is subsequently thinned by grinding from the stress-loaded rear side to an extent such that it separates into individual semiconductor chips. This procedure is also referred to as "dicing before grinding" or the DBG technique. Methods of this type require additional manufacturing processes and significantly higher manufacturing costs. In addition, problems remain unsolved, such as a slow separating speed, a non-stable cut quality and a high consumption of diamond saw blades, which are fundamentally associated with the diamond sawing of semiconductor crystals.

In order also to enable the entire semiconductor wafer to be sawn through in fracture-free fashion by using diamond saw blades, in the methods disclosed in the document US 2005/0003633 A1, the stress-loaded rear side of the semiconductor wafer is very largely leveled at least in the region of the separating tracks by using laser removal or by using laser melting of the rear side material and is annealed with low stress by using the laser treatment. This laser pretreatment has the effect that diamond sawing along the separating joints leads to improved edges of the semiconductor chips in the respective semiconductor chip positions.

The document JP 19860178392 discloses a laser separating method for improving the quality during the formation of separating joints in a semiconductor wafer by firstly introducing sawing joints by using a saw blade, which are then extended as far as the rear side of the semiconductor wafer by using laser light. The semiconductor wafer is separated by melting in this case. For this purpose, the semiconductor wafer is applied to a self-adhesive surface of a self-adhesive film including a UV-curable resin adhesive. The semiconductor wafer is then fixed on the film by using thermocompression bonding. Finally, the separating joints are sawn in along the separating tracks of the semiconductor wafer and the further wafer material is exposed to a laser cutting device and separated by projection of the laser light.

Since the semiconductor material not separated by the saw is separated by laser light, fractures of the semiconductor chips during removal from the film are prevented. In addition, the laser separation makes it possible to shorten the processing time and simultaneously to improve the cutting quality for the semiconductor wafer. However, two technically different separating methods are combined, which puts a burden on the manufacturing costs.

The document JP 19870527 discloses a similar method, which involves firstly effecting sawing to a predetermined depth by using a diamond saw along the separating tracks, and then severing the remainder, which amounts to approximately 20 micrometers, by using a laser in order not to produce any chipping in the bottom region. For this purpose, the laser is guided in a water jet and at the same time the diameter of the laser beam is set to be smaller than the thickness of the separating saw blade.

This water jet guidance for the laser beam has the disadvantage that this manufacturing requires complicated measures for carrying away the volume of water that arises. In some instances it is necessary to use specially porous and water-permeable films, which impede further manufacturing processes, so that such porous and water-permeable films also have to be removed again from the separated semiconductor chips before further processing.

Silicon wafers that are singulated by a laser process nevertheless have a greatly reduced breaking strength. A reduced breaking strength can lead to a semiconductor chip fracture in the subsequent manufacturing and mounting processes, such as semiconductor chip bonding, bond wire bonding, injection-molding processing or soldering, such that unacceptable manufacturing rejects arise.

FIGS. 12 to 15 illustrate this problem of laser cutting in the prior art.

FIG. 12 illustrates a schematic cross section through a portion 13 of a semiconductor wafer 1 in the region of a separating track 6 arranged between two semiconductor chip positions 5 of the semiconductor wafer 1. The width b of the separating track 6 is marked in an optically visible manner by corresponding edge structures 10 and 11 on the top side 12 of the semiconductor wafer 1. Semiconductor component structures associated with the respective semiconductor chip positions 5 are arranged in the regions 14 near the surface of the semiconductor wafer 1.

FIG. 13 illustrates a schematic cross section through the portion 13 in accordance with FIG. 12 during irradiation of the separating track 6 by a laser ablation beam 9, which brings about material removal in the cross hatched region with crystallographic strain 7 in the semiconductor wafer 1 along the separating track 6.

FIG. 14 illustrates a schematic cross section through the portion 13 in accordance with FIG. 12 after removal of part of the semiconductor material to form a separating joint 15 in the region of the separating track 6. This gives rise to an amorphous region 21 made of semiconductor material at the edges 16 and 17 of the separating joint 15, which region arises as a result of momentary melting of the edge sides 16 and 17 during laser irradiation. In terms of the mass density and in terms of further mechanical properties, such amorphous silicon differs significantly from the monocrystalline silicon 22 of which the semiconductor wafer 1 is composed. This produces, at the boundary or in the region of the edge sides 16, 17, excessive amorphous-crystalline-mechanical stress increases that can lead to the nucleation of cracks and to the reduction of the flexural breaking strength of the semiconductor chip that arises.

FIG. 15 illustrates a schematic cross section through the portion 13 in accordance with FIG. 14 after the severing of the semiconductor wafer 1 with the jeopardized, amorphously solidified edges 16 and 17 of the separating joint, the profile 18 of the crystallographic strain being illustrated as a diagram. It becomes clear that the highest strain 23 lies in the transition from the amorphous region 21 to the monocrystalline region 22. Such amorphization cannot be prevented even by a water jet and thus by water jet conducted and cooled laser beam removal, especially as the amorphous state of an inherently crystalline semiconductor material is effected only by quenching of a melt and hence solidification in the melt-like state.

SUMMARY

One embodiment includes singulating semiconductor wafers to form semiconductor chips. A semiconductor wafer is provided with semiconductor chip positions arranged in rows and columns, rectilinear separating tracks being arranged between the positions. Crystallographic strains are induced into the region of the separating tracks. This is followed by a laser ablation along the separating tracks, the semiconductor wafer being separated into individual semiconductor chips.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention will now be explained in more detail with reference to the accompanying figures.

FIG. 2 illustrates a schematic cross section through the portion of a semiconductor in the region of a separating track.

FIG. 3 illustrates a schematic cross section through the portion in accordance with FIG. 2 during the induction of strains in the region of the separating track by using laser irradiation.

FIG. 4 illustrates a schematic cross section through the portion in accordance with FIG. 3 after induction has been effected.

FIG. 5 illustrates a schematic cross section through the portion in accordance with FIG. 4 after heat treatment of the semiconductor wafer.

FIG. 6 illustrates a schematic cross section through the portion in accordance with FIG. 5 after laser ablation in the region of the separating track.

FIG. 7 illustrates a schematic cross section through the portion of the semiconductor wafer in the region of the separating track.

FIG. 8 illustrates a schematic cross section through the portion in accordance with FIG. 7 during the induction of strains in the region of the separating track by using ion implantation.

FIG. 9 illustrates a schematic cross section through the portion in accordance with FIG. 8 after induction has been effected into a region of the separating track.

FIG. 10 illustrates a schematic cross section through the portion in accordance with FIG. 9 after heat treatment of the semiconductor wafer.

FIG. 11 illustrates a schematic cross section through the portion in accordance with FIG. 10 after laser ablation in the region of the separating track.

DETAILED DESCRIPTION

Figure 1:
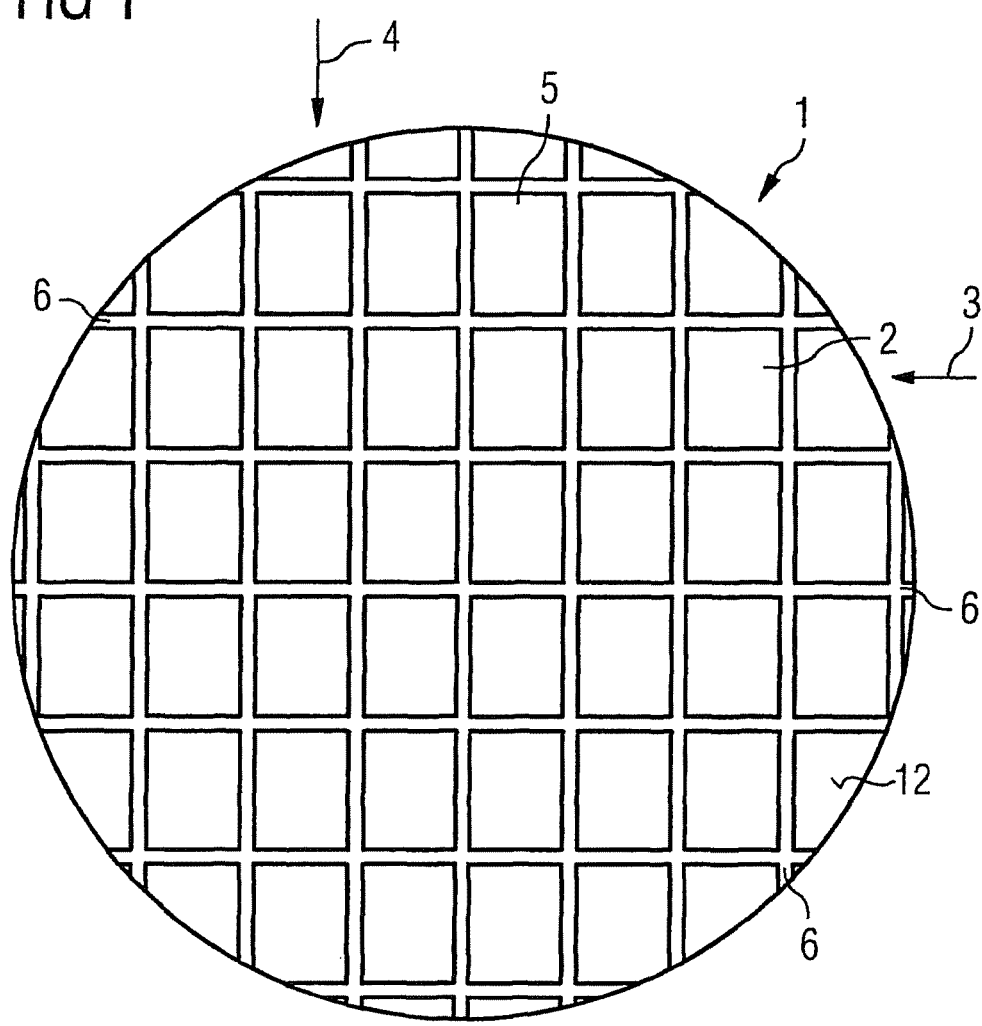
FIG. 1 illustrates a schematic plan view of a semiconductor wafer that is to be singulated into semiconductor chips.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment specifies a method for singulating semiconductor wafers to form semiconductor chips which enables a higher throughput by using fast laser ablation and in addition enables an improved cutting quality in conjunction with reduced risk of fracture and improved breaking strength of the semiconductor chips.

One embodiment provides a method for singulating semiconductor wafers to form semiconductor chips. The process involves producing a semiconductor wafer having semiconductor chip positions arranged in rows and columns, separating tracks being arranged between the chip positions. In order to prepare for the singulation, crystallographic strains are induced into the region of the separating tracks. A laser ablation is then carried out along the separating tracks. The semiconductor wafer is separated into individual semiconductor chips in the process.

This method ensures that the stresses which arise at the semiconductor chip edge during laser ablation, as illustrated in FIGS. 12 to 15, are induced into the semiconductor chip volume over a larger region than is the case when purely carrying out laser cutting, as is illustrated in FIGS. 12 to 15. In this case, a strain similar in magnitude to that also caused by the laser ablation process arises at the semiconductor chip edge, but the laser cutting or the laser ablation is then effected in a region with a mechanically more relaxed environment. Furthermore, a lateral indiffusion and in part also annealing of the beam damage can be achieved by using heat treatment processes, such that the desired mechanical stress conditions are established in the semiconductor chip edge region. Consequently, an increase in the breaking strength of laser-cut semiconductor chips is achieved by the introduction or induction of prior damage in the region of the separating track.

In one embodiment of the invention, the induction of crystallographic strains into the region of the separating tracks is effected by using ion implantation of charged particles and/or ionized atoms that can be incorporated interstitially into the monocrystalline lattice of a semiconductor crystal. The lattice is expanded and thus strained by these interstitially incorporated charged particles and/or ionized atoms, such that prior damage of the lattice is achieved by increased crystallographic strains.

Carbon ions, nitrogen ions, oxygen ions and/or silicon ions can be used for the ion implantation. As long as no heat treatment process is effected, such ions are positioned at interstitial sites and expand the lattice. During heat treatment, however, carbon ions, which have a smaller effective radius than the semiconductor atoms at the lattice sites made of silicon, cause a strain of the lattice by contraction, while in the case of nitrogen ions and oxygen ions a crystallographic strain of the lattice is effected by expansion of lattice spacings. The effect of silicon ions is virtually neutralized by heat treatment, however, since, in a silicon host lattice, they are then arranged at lattice sites during the heat treatment.

In order to increase the crystallographic strain, it is also possible for noble gas ions to be arranged or induced in the region of the separating tracks. Such noble gas ions at interstitial lattice sites tend to extend the lattice and thus increase the crystallographic strain in the region of the separating tracks.

Instead of ion implantation, it is also possible to effect irradiation by using protons or by using alpha-particles, such that an induction of crystallographic strains in the region of the separating track is effected by using protons or by using alpha-particles. The protons or alpha-particles have a higher penetration depth compared with carbon ions, nitrogen ions, oxygen ions or silicon ions given the same implantation energy, such that the prior damage can completely penetrate through the semiconductor wafer in the separating tracks by using a single proton irradiation or by using a single alpha-particle irradiation.

A further possibility for achieving an induction of crystallographic strains is to implant ions from the group of the transition metals and/or from the group of the lanthanides. These significantly larger ions bring about significantly greater damage to the monocrystalline semiconductor lattice in the region of the separating tracks, but the penetration depth is limited, with the result that such large ions are to be introduced into the semiconductor crystal by ion implantation in a plurality of stages possibly one after another, that is to say serially.

A further exemplary implementation of the method consists in achieving the induction of crystallographic strains in the regions of the separating tracks by using irradiation with formation of vacancy clusters. Vacancy clusters are an accumulation of lattice vacancies that is achieved by electromagnetic irradiation.

In this case, the irradiation for forming vacancy clusters can be effected by using infrared lasers. Infrared lasers can completely illuminate the silicon crystal throughout, on the one hand, and/or given correspondingly high excitation ensure, on the other hand, that silicon atoms are removed from their lattice sites to leave vacancies.

Such laser irradiation through the entire crystal with formation of vacancy clusters can be achieved by performing the depth of focus setting of the laser beam in depth-staggered fashion, such that the entire semiconductor thickness is successively subjected to prior damage in the region of the separating tracks.

Moreover, it is also possible, instead of a depth-staggered focusing of the laser beam during the laser irradiation, to carry out the latter with a differing laser wavelength, since the highest absorption of laser beams takes place by using UV lasers in regions near the surface and by using correspondingly adapted infrared lasers in deeper regions, such that laser irradiation with staggered variation of the laser wavelength, in the range from near UV to far infrared, promotes successful and continuous vacancy cluster formation. Such a semiconductor wafer subjected to prior damage can then be subjected to heat treatment, for example, in order laterally to introduce the concentration of vacancy clusters and/or impurity atoms into the volume of the semiconductor from the separating tracks.

In order to separate the semiconductor wafer into individual semiconductor chips, a laser ablation along the separating tracks is provided after the prior damage of the semiconductor wafer in the separating tracks, in which case, in one embodiment of the invention, the semiconductor wafer is severed in its entire thickness by using laser cutting.

In a further embodiment of the invention, by using laser ablation along the separating tracks, only separating joints are produced whose depth is smaller than the thickness of the semiconductor wafer. By virtue of the increased strain, however, in the remaining region of the severed region of the semiconductor wafer material below the separating joints, it is now possible to split the semiconductor wafer into individual semiconductor chips by using an expandable film with tensile loading of the semi-conductor wafer, without chipping occurring on the rear side of the semiconductor wafer and without the breaking strength of the semiconductor chips being impaired.

A further possibility, in the case of a semiconductor wafer preprepared in this way with a separating joint prepared with the aid of a laser ablation, for subsequently severing the residual semiconductor material below the separating joint consists in using a flexible film on which the semiconductor wafer is situated during the introduction of the separating joint, in order subsequently to split the semiconductor wafer into individual semiconductor chips with flexural loading of the semiconductor wafer.

In all three embodiments, namely complete severing in the region of the separating joints, partial severing and subsequent expansion, and partial severing by laser and subsequent flexural splitting into individual semiconductor chips, what can be achieved in a manner is that the risk of fracture of the semiconductor chips is reduced and splitting of fragments, particularly in the rear side region of the semiconductor chips, is prevented. At the same time, these methods have the advantage that leveling of the rear side with the aid of laser melting is not necessary. In addition, this method has the advantage that a diamond sawing technique can be completely omitted.

FIG. 1 illustrates a schematic plan view of a semiconductor wafer 1 that is to be singulated into semiconductor chips 2. For this purpose, the semiconductor wafer 1 has semiconductor chip positions 5 arranged in rows 3 and columns 4 on the top side 12 of the semiconductor wafer 1. The semiconductor chip positions 5 are delimited by rectilinear separating tracks 6 provided for the singulation of the semiconductor wafer 1.

FIGS. 2 to 6 illustrate method processes on the basis of a portion 13 of a semiconductor wafer 1 in the region of a separating track 6.

Figure 2:
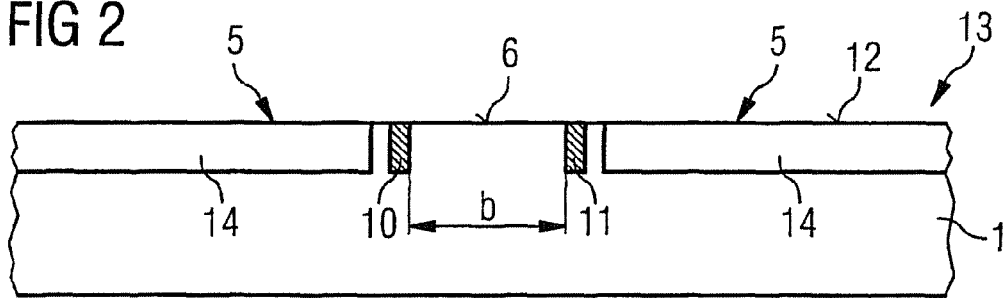
FIGS. 2 to 6 illustrate method processes on the basis of a portion of a semiconductor wafer in the region of a separating track.

FIG. 2 illustrates a schematic cross section through the portion 13 of a semiconductor wafer 1 in the region of the separating track 6, the width b of which is delimited by optically visible edge markings 10 and 11. The semiconductor chip positions 5 arranged adjacent to the separating track 6 and the markings 10 and 11 have semiconductor elements associated with integrated circuits of the semiconductor chips in the regions 14 near the surface of the semiconductor wafer 1. The width b of the separating track 6 is provided in such a way that the tolerance during the alignment of the semiconductor wafer 1 on a support that can be moved in the x and y directions and the tolerance of the positioning of a laser beam can be taken into account, such that the optically visible markings 10 and 11 are not overshot during the separating operation.

Figure 3:
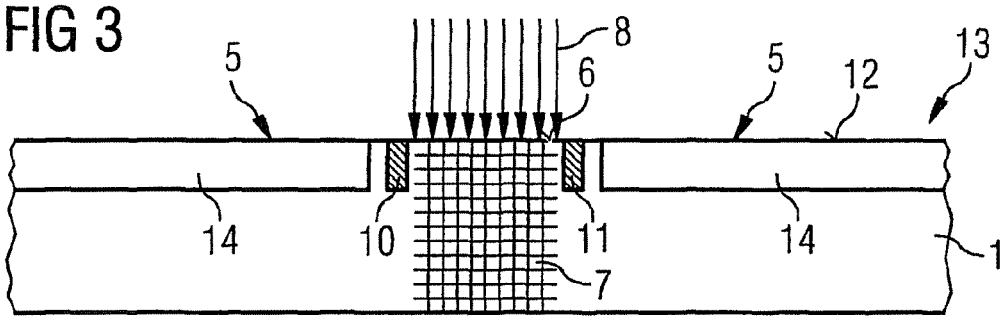

FIG. 3 illustrates a schematic cross section through the portion 13 of a semiconductor wafer 1 in the region of the separating track 6 during the irradiation of the separating track 6 with the aid of a laser beam 8. The energy of the laser beam 8 is set in such a way that laser ablation does not occur in the region of the separating track 6, rather stresses are generated in the semiconductor body of the semiconductor wafer 1 in the region of the separating track 6 through formation of vacancy clusters, which stresses enable a relaxation with strains that arise as a result of the laser ablation operation. In this exemplary implementation of the method, the entire thickness of the semiconductor wafer in the region of the separating track 6 is provided with crystallographic strains with formation of vacancy clusters by using laser bombardment, thereby producing the profile of the strains in the lateral direction that is illustrated in FIG. 4.

Figure 4:
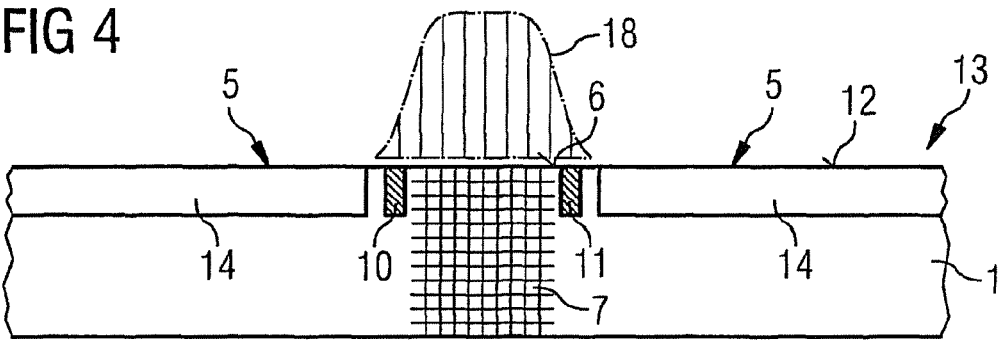

FIG. 4 illustrates a schematic cross section through the portion 13 in accordance with FIG. 3 after induction of crystallographic strains in the semiconductor material has been effected. In this case, the crystallographic strain is greatest in the central region of the separating track 6 and abates in the lateral direction toward the sides of the separating track 6. In order to achieve a widening of the region subjected to prior damage, a heat treatment process is carried out next.

Figure 5:
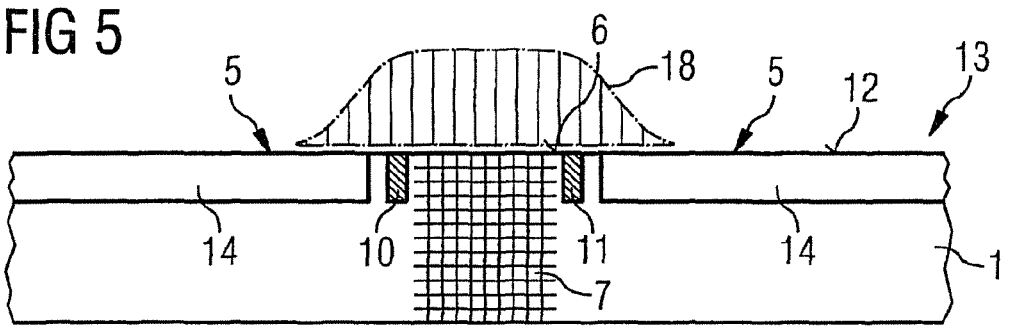

FIG. 5 illustrates a schematic cross section through the portion 13 in accordance with FIG. 4 after heat treatment of the semiconductor wafer 1. In this case, the profile 18 of the strain in the region of the separating track 6 exhibits a reduction, while the strains have widened in the lateral direction beyond the edge structure markings 10 and 11.

Figure 6:
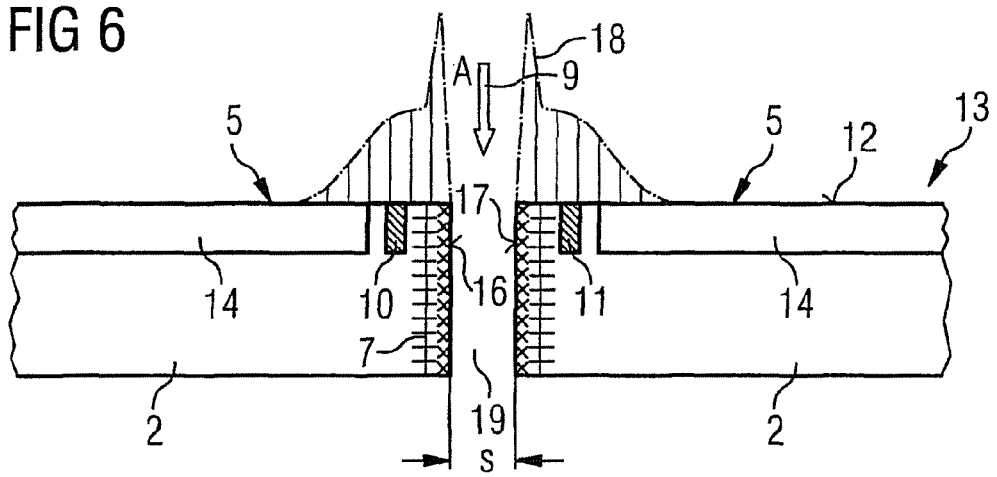

FIG. 6 illustrates a schematic cross section through the portion 13 in accordance with FIG. 5 after laser ablation in the region of the separating track 6. During the laser ablation 9 in arrow direction A, although there are also amorphous regions situated in the region of the edges 16 and 17 of the separating gap 19 with a width s, the monocrystalline material of the semiconductor that has been subjected to prior damage is loaded to a lesser extent by this amorphous structure, which is illustrated by the profile 18 of the strain now present. The strain 18 in the lateral direction into the semiconductor material abates in a larger region than in the case of the stress profiles illustrated in FIGS. 12 to 15.

Both the laser ablation 9 illustrated in FIG. 6 and the laser irradiation 8 illustrated in FIG. 3 can be effected in depth-staggered fashion by using a focused laser beam whose focus is varied in depth-staggered fashion. Another possibility consists in achieving a depth staggering by varying the wavelength of the laser beam, a UV laser being used near the surface and an infrared laser with corresponding focusing being used in deeper regions.

FIGS. 7 to 11 illustrate methods processes on the basis of a portion 13 of a semiconductor wafer 1 in the region of a separating track 6, laser irradiation not being effected in this method variant, rather an ion implantation being provided. The ion implantation is effected in different depths of the semiconductor material depending on the implantation energy. For this purpose, the ion implantation energy can be raised continuously or in processes.

Figure 7:
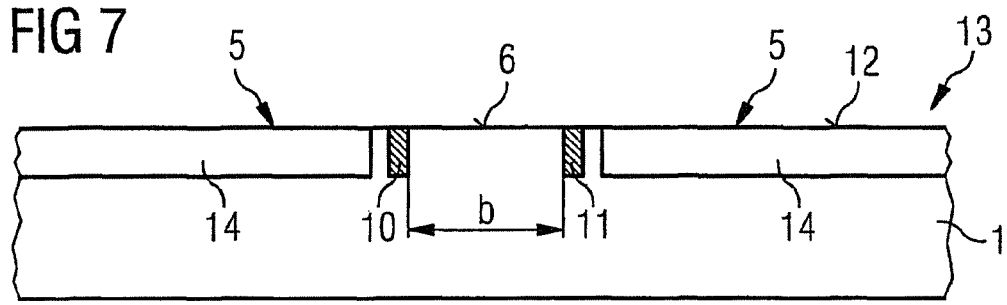
FIG. 7 to 11 illustrate method processes on the basis of a portion of a semiconductor wafer in the region of a separating track.

FIG. 7 illustrates a schematic cross section through the portion 13 of the semiconductor wafer 1 in the region of the separating track 6. Components having the same functions as in the previous figures are identified by the same reference symbols and are not discussed separately in FIGS. 7 to 11. FIG. 7 corresponds to FIG. 2, and so a discussion is unnecessary.

Figure 8:
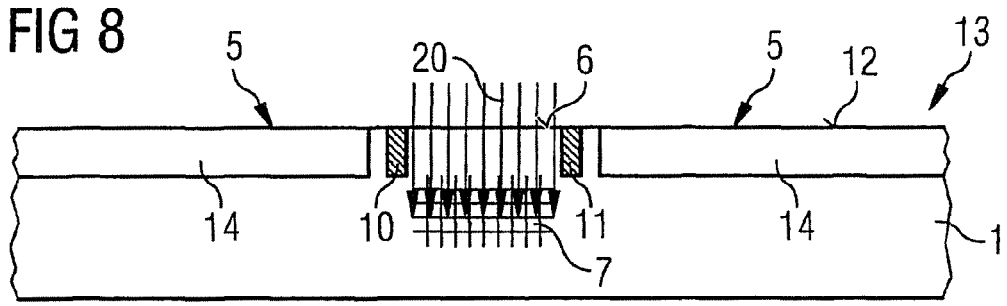

FIG. 8 illustrates a schematic cross section through the portion 13 in accordance with FIG. 7 during the induction of strains 7 in the region of the separating track 6. For this purpose, the separating track 6 is irradiated with ions over its entire width b; the types of ions have been described in detail above and are therefore not repeated again at this juncture. In principle, the ions radiated in bring about damage to the crystal lattice by virtue of the ions settling at interstitial lattice sites in the Bragg deceleration region. The depth of the Bragg deceleration region depends on the size of the implanted ions and the intensity of the irradiation with which the ions are irradiated in. The larger the individual ion, the higher the degree of damage to the crystal lattice, such that a high concentration of strains can be achieved in the Bragg deceleration region.

Figure 9:
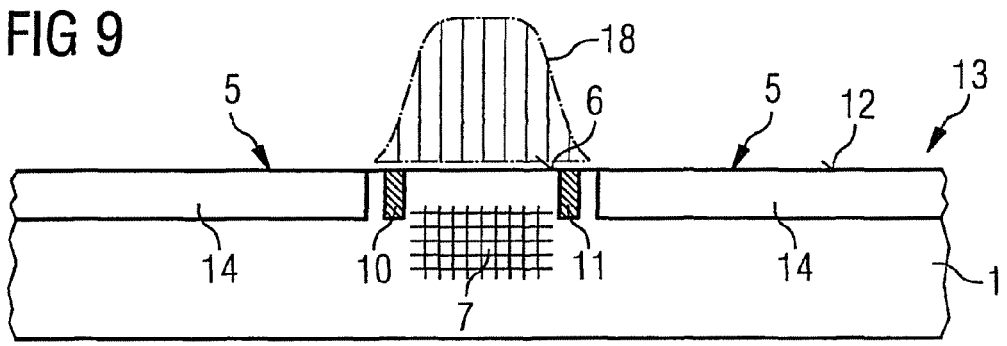

FIG. 9 illustrates a schematic cross section of the portion 13 in accordance with FIG. 8 after induction of a crystallographic strain into a region of the separating track 6 has taken place. In addition, FIG. 9 illustrates the profile 18 of the strains in the region of the separating track 6. In this case, the strains 7 are concentrated on the central region of the semiconductor wafer 1, but generally the intensity is varied in such a way that the entire thickness of the semiconductor wafer 1 in the region of the separating track 6 is subjected to prior damage.

Figure 10:
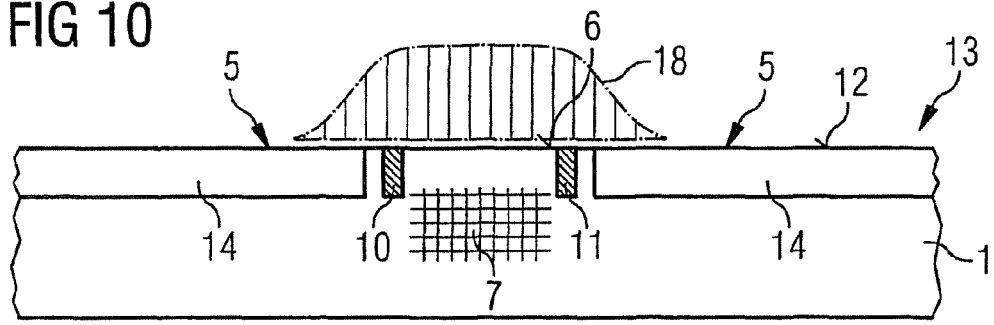

FIG. 10 illustrates a schematic cross section through the portion 13 in accordance with FIG. 9 after heat treatment of the semiconductor wafer 1. In this case there is a widening of the profile 18 of the damage in the lateral direction, and at the same time a decrease in the maximum damage in the region of the separating track 6.

Figure 11:
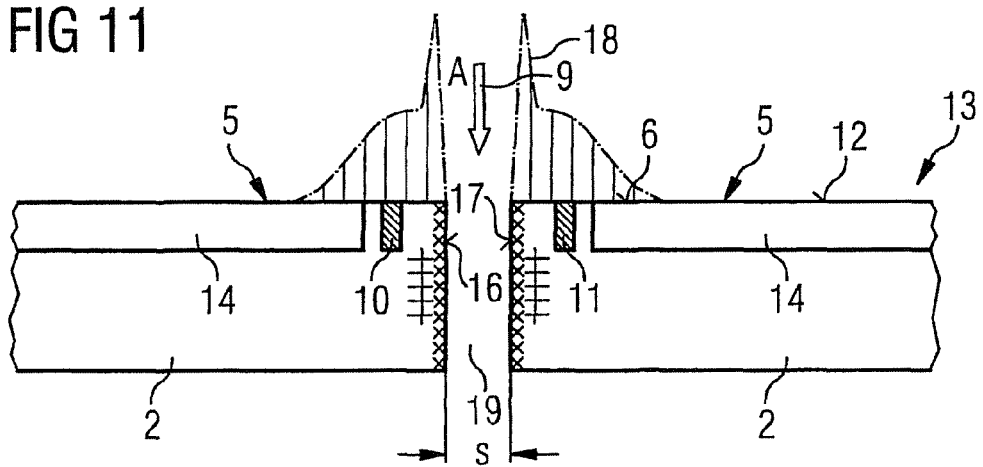
Figure 12:
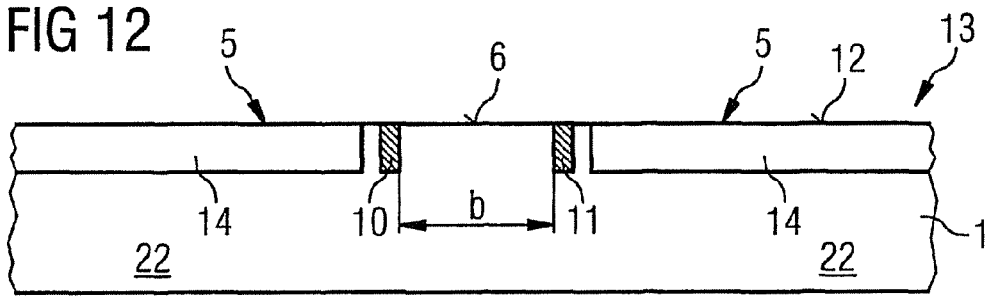
FIGS. 12 to 15 illustrate method processes on the basis of a portion of a semiconductor wafer during singulation of the semiconductor wafer into individual semiconductor chips in accordance with the prior art.
Figure 13:
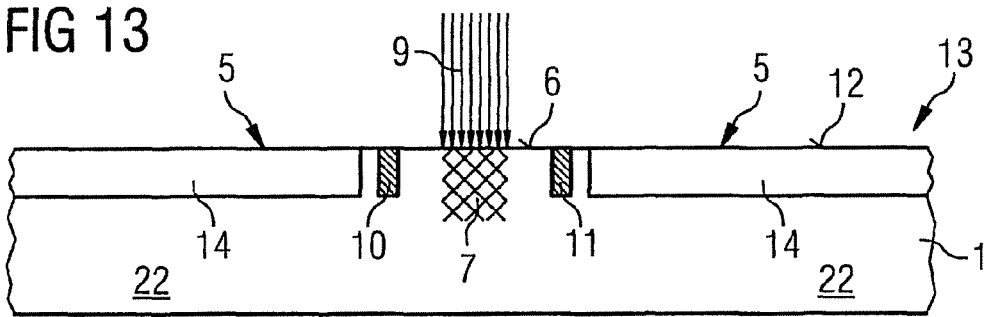
Figure 14:
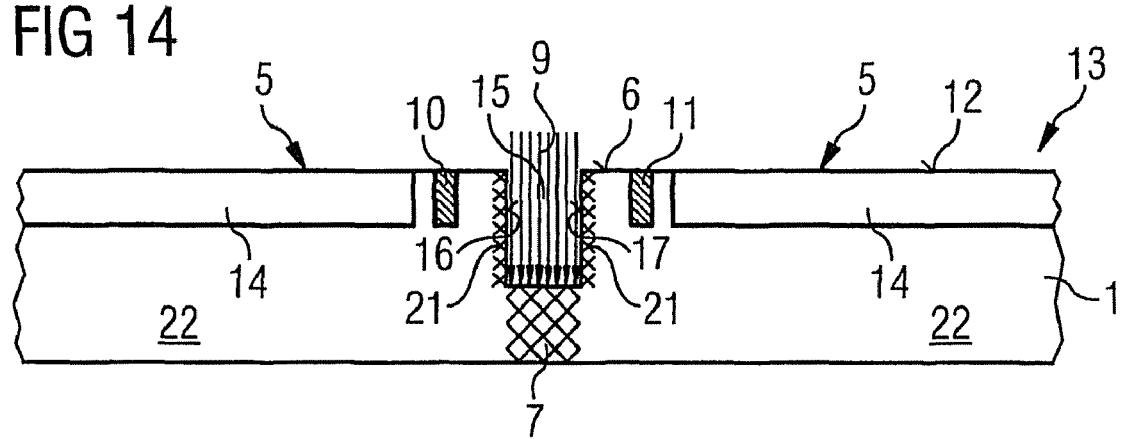
Figure 15:
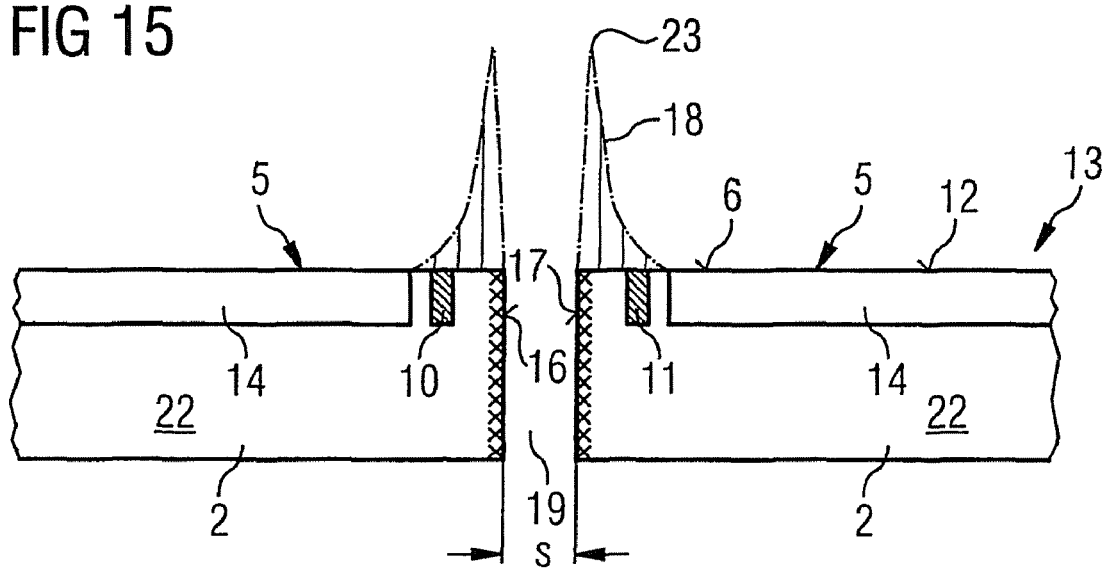

Finally, FIG. 11 illustrates a schematic cross section of the portion 13 in accordance with FIG. 10 after laser ablation 9 in arrow direction A in the region of the separating track 6. The effect of the prior damage or the induced crystallographic strain is the same as in the case of prior damage by laser irradiation as was illustrated in FIGS. 2 to 6.

The further FIGS. 12 to 15 illustrate method processes on the basis of a portion 13 of a semiconductor wafer 1 in the region of a separating track 6 for singulating the semiconductor wafer 1 into individual semiconductor chips in accordance with the prior art. These method processes have already been discussed in detail in the introduction to the description.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for singulating semiconductor wafers to form semiconductor chips, the method comprising:
   producing a semiconductor wafer having semiconductor chip positions arranged in rows and columns, separating tracks having a width being arranged between the semiconductor chip positions;
   inducing crystallographic strains into the region of the separating tracks across at least the full width of separating tracks, the induced crystallographic strains having a strain profile;
   performing a heat treating process to widen and provide a more uniform strain profile of the induced crystallographic strains relative to the width of the separating tracks;
   laser ablating along the separating tracks; and
   separating the semiconductor wafer into individual semiconductor chips.

2. The method of claim 1, wherein the induction of crystallographic strains into the region of the separating tracks is effected by using ion implantation of charged particles and/or ionized atoms that can be incorporated interstitially into the monocrystalline lattice of a semiconductor crystal.

3. The method of claim 1, wherein the induction of crystallographic strains into the region of the separating tracks is effected by using ion implantation of carbon ions, nitrogen ions, oxygen ions and/or silicon ions.

4. The method of claim 1, wherein the induction of crystallographic strains into the region of the separating tracks is effected by using noble gas ions.

5. The method of claim 1, wherein the induction of crystallographic strains into the region of the separating tracks is effected by using protons.

6. The method of claim 1, wherein the induction of crystallographic strains into the region of the separating tracks is effected by using alpha-particles.

7. The method of claim 1, wherein the induction of crystallographic strains into the region of the separating tracks is effected by using ions from the group of the transition elements and/or from the group of the lanthanides.

8. The method of claim 1, wherein the induction of crystallographic strains into the region of the separating tracks is effected by using irradiation with formation of vacancy clusters.

9. The method of claim 8, wherein the irradiation with formation of vacancy clusters is effected by using infrared laser irradiation.

10. The method of claim 8, wherein the irradiation with formation of vacancy clusters is effected by using laser irradiation with setting of depth-staggered focusing depths.

11. The method of claim 8, wherein the irradiation with formation of vacancy clusters is effected by using laser irradiation with staggered variation of the laser wavelength, in the range from near UV to far infrared.

12. The method of claim 1, wherein in order to separate the semiconductor wafer into individual semiconductor chips, the provided laser ablation along the separating tracks severs the semiconductor wafer in its entire thickness.

13. The method of claim 1, wherein during the laser ablation along the separating tracks, separating joints are produced whose depth is smaller than the thickness of the semiconductor wafer.

14. The method of claim 13, wherein in order to separate the semiconductor wafer into individual semiconductor chips, that region of the semiconductor wafer material which is not severed by laser ablation, below the separating joints, is split with the aid of an expandable film with tensile loading of the semiconductor wafer.

15. The method of claim 13, wherein in order to separate the semiconductor wafer into individual semiconductor chips, that region of the semiconductor wafer material which is not severed by laser ablation, below the separating joints, is split with the aid of a flexible film with flexural loading of the semiconductor wafer.

* * * * *